United States Patent [19]

Mohebban

[11] Patent Number: 4,823,078
[45] Date of Patent: Apr. 18, 1989

[54] DEVICE FOR A.C. VOLTAGE TESTING USING A VOLTAGE MULTIPLIER AND LCD DISPLAY

[75] Inventor: Manoochehr Mohebban, Foster City, Calif.

[73] Assignee: Raychem Corporation, Menlo Park, Calif.

[21] Appl. No.: 121,505

[22] Filed: Nov. 16, 1987

[51] Int. Cl.⁴ .................. G01R 19/155; G01R 31/00
[52] U.S. Cl. ........................ 324/133; 324/96; 324/72.5; 350/332
[58] Field of Search ............ 324/133, 72.5, 435, 324/149, 96, 122; 340/660, 753; 350/332, 335

[56] References Cited

U.S. PATENT DOCUMENTS

| | | | |
|---|---|---|---|
| 3,613,351 | 10/1971 | Walton | 350/332 X |
| 3,654,606 | 4/1972 | Marlowe et al. | 350/332 X |
| 3,774,195 | 11/1973 | Schulthess et al. | 340/753 |
| 4,139,820 | 2/1979 | Rode | 324/96 X |
| 4,259,634 | 3/1981 | Okamoto et al. | 324/96 X |
| 4,503,389 | 3/1985 | Singer | 324/133 |
| 4,559,496 | 12/1985 | Harnden, Jr. | 324/127 |

*Primary Examiner*—Reinhard J. Eisenzopf
*Assistant Examiner*—Jack B. Harvey
*Attorney, Agent, or Firm*—Yuan Chao; Edith A. Rice; Herbert G. Burkard

[57] ABSTRACT

A voltage tester, particularly for relatively low voltage A.C., comprises a device having a contact for electrical connection to an electrical component, and a contact that may be touched by an operator through whom capacitive connection may be made to earth. The device includes liquid crystal displays powered by the voltage under test via a voltage multiplier.

4 Claims, 2 Drawing Sheets

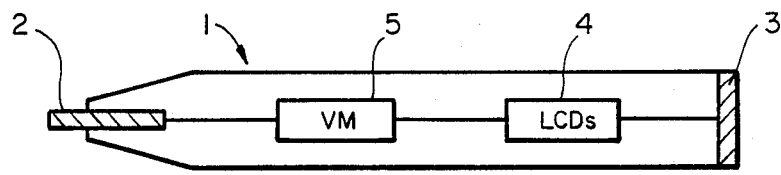
FIG_1
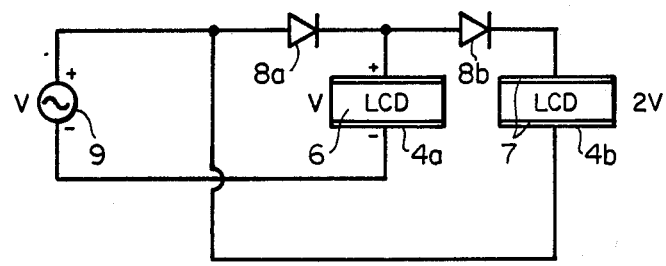
FIG_2A
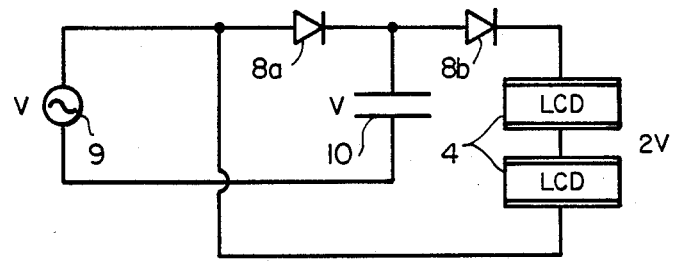
FIG_2B

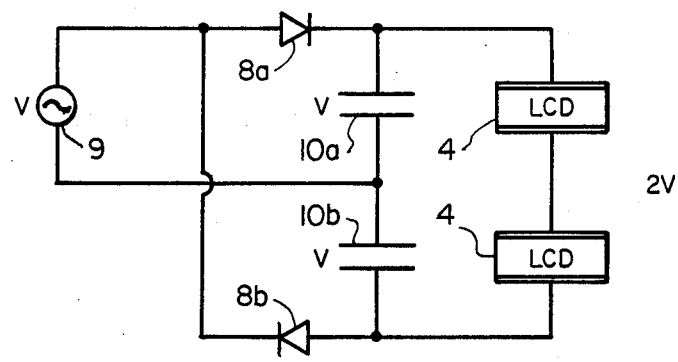
FIG_3
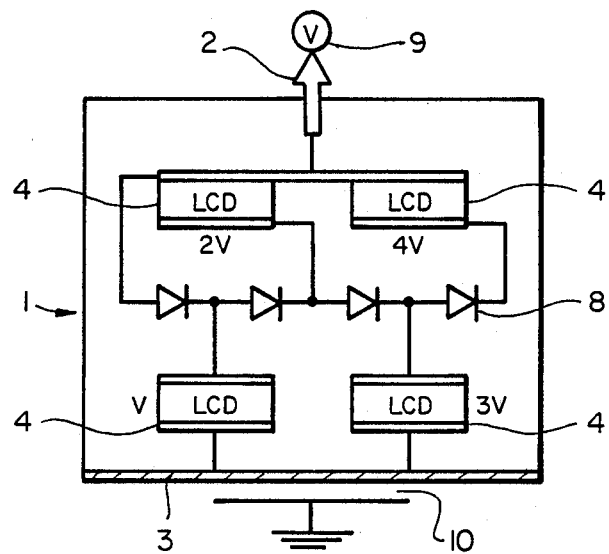
FIG_4

DEVICE FOR A.C. VOLTAGE TESTING USING A VOLTAGE MULTIPLIER AND LCD DISPLAY

BACKGROUND OF THE INVENTION

The present invention relates to a device for testing voltage, particularly without the consumption of a significant amount of power. Testing may involve merely a determination of whether there exists a voltage above a certain value, or it may involve measurement of voltage more precisely.

It is often desirable to test for voltage in order to determine whether an electrical component is live, for example before service work is carried out, to determine whether an electrical component is functioning properly, or to provide some information about an event which gives rise to a characteristic voltage.

Clearly, simple voltmeters, such as a permanent-magnet moving-coil voltmeter, are used for many voltage measurements, particularly for low voltage D.C. Such instruments may be expensive and bulky and not suitable for high voltage A.C. where it is desirable that little power be drawn, or where for safety a capacitive (rather than direct or ohmic) connection to the voltage source is desired.

Liquid crystals are known which respond to voltage and may therefore be used as part of a voltage testing device. In general, such liquid crystals are long chain molecules that, in the presence of an applied electric field, become aligned and therefore exhibit a quasi-crystalline structure. Molecular configuration is thus a function of electrical field; and, since molecular configuration affects the material's optical properties (principally reflectivity), the material is able to give a visual indication of applied electrical field. As voltage is increased from a low value, first the so-called "threshold voltage" is reached where a realignment of the liquid crystal's molecules begins, causing a visible change. Then the "saturation voltage" is reached at which point the realignment is complete.

Since liquid crystals do not emit light, liquid crystal displays (LCDs) require some external source of light if a change in reflectivity etc. is to be viewed. Daylight may be the source of light, or some special illumination may be provided, generally behind the LCD, and powered either from the electrical component to be tested or from a separate source. The provision of some special illumination is preferably avoided, but daylight is often inadequate to allow a change in reflectivity of small LCDs to be viewed, at least at any practical distance. One solution perhaps is to employ a large LCD, or an array of small LCDs, but this too has problems. If a large LCD or an array of LCDs in parallel is used, a large amount of power is required due to a large capacitance. Alternatively, if an array of LCDs in series is used a large voltage is required to cause the desired change in optical properties. Since the threshold voltage is fixed in advance by the job the device has to do, a series array may not be a possible solution.

We have discovered that this problem can be overcome by increasing the initial input voltage in a certain way. A prior art ammeter may be mentioned at this stage since it employs a transformer together with an array of LCDs. U.S. Pat. No. 4,559,496 to Harnden Jr. et al. discloses a low cost hook-on ammeter for consumer use that includes a split core that may clipped around an insulated conductor carrying the current to be measured. This conductor thus acts as a single turn primary winding around a transformer core. Secondary turns around the core activate a LCD, segments of which are connected to individual taps on the secondary winding. As current in the conductor increases, the secondary voltage increases turning on an increasing number of segments of the LCD.

Whilst such a device may be useful for current measurement in accessible conductors, it is unlikely to be suitable for voltage measurement where limited power is to be drawn, or where accessibility is a problem.

SUMMARY OF THE INVENTION

The present invention provides a voltage testing device for testing the voltage of an electrical component, which comprises:

(a) a LCD;

(b) a voltage multiplier; the LCD being connected to an output of the voltage multiplier; and (c) electrical contacts connected to an input of the voltage multiplier by means of which electrical connection can be made between the voltage multiplier and the electrical component.

A voltage multiplier has particular advantages in this context since it may operate with merely capacitive contacts to the electrical component, and need draw very little power.

The electrical component whose voltage is to be tested may be one which is intended to be subjected to a voltage, or it may be some other component that becomes live only on the occurrence of a fault. For example, the device may be used for testing (and optionally also for measuring) voltage on a high voltage power line, or for testing the high voltage side of an automobile ignition system.

Where an array of LCDs is provided, they may be electrically connected together for example in series, and terminal LCDs of the array connected to a single output of the voltage multiplier. Different LCDs within that array may have different threshold voltages, so that the value of the voltage under test (multiplied by a known factor) will be manifest as a certain pattern of reflectances within the array. Thus, a quantitative indication of voltage may be obtained.

Instead of, or in addition to, a series array being connected to a single output of a voltage multiplier, separate LCDs (or separate arrays of LCDs) may be provided as the various capacitors of the voltage multiplier. Since different voltages are generated across the various capacitors of a voltage multiplier (assuming no losses: V, 2 V, 3 V, etc. where V is the applied voltage, i.e. that under test) LCDs (or arrays) of different threshold voltages may be used. For example a single LCD of threshold voltage V could be used at the first stage of a voltage multiplier, two such LCDs in parallel could be used at a second stage, and three at a third stage. That would provide an easily visible device where (assuming no losses) all LCDs showed an optical change at an applied voltage V. If a single LCD were used as the capacitor at all stages of the voltage multiplier, then the third stage LCD would change at an input voltage or V/3, the second stage at V/2 and the first stage at V. In this case a quantitative measurement of voltage is obtained. It can be seen that various combinations of LCDs or of arrays of LCDs of various capacitance and threshold voltage may be made to produce a voltage measuring device having the desired characteristics.

Thus, the invention also provides a voltage testing device which comprises a voltage multiplier at least one capacitor of which is provided by a LCD.

The invention further provides a voltage measuring device which comprises a voltage multiplier, at least two capacitors of which comprise respective LCDs, the threshold voltages of the LCDs and the stage in the voltage multiplier at which they are located, being such that respective LCDs show an optical change at different test voltages.

The invention also provides a method of testing for an A.C. voltage of rms which comprises: electrical component, (a) providing a voltage testing device comprising a voltage multiplier and an LCD whose threshold voltage is greater than $V_{rms}$, the LCD being connected to an output of said voltage multiplier such that the LCD undergoes an optical change on the application of a voltage of $V_{rms}$ to an input of the voltage multiplier;

(b) electrically connecting said input to the electrical component; and (c) observing an optical state of the LCD.

The invention may be used to test for a D.C. voltage by employing means such as an oscillator to produce the alternating voltage necessary to drive the voltage multiplier.

BRIEF DESCRIPTION OF THE DRAWINGS

FIG. 1 shows schematically a device according to the invention;

FIGS. 2A and 2B show LCDs and a cascade voltage multiplier;

FIG. 3 shows LCDs and a conventional voltage multiplier; and

FIG. 4 shows a device of the invention having four LCDs.

DESCRIPTION OF THE PREFERRED EMBODIMENTS

A voltage multiplier as preferred for use in the present invention preferably comprises electrical components by means of which voltage of one half cycle of the voltage to be tested is developed across a first capacitor (which may itself comprise an LCD) and during a subsequent, opposite, half cycle either (a) voltage is directly added to that previously developed across the first capacitor or (b) is developed across a second capacitor such that the total voltage across the two capacitors is substantially equal to double the original peak voltage. The first of these possibilities may be referred to as a cascade voltage doubler, and the second as a conventional voltage doubler. The selective charging of different capacitors during alternate half cycles is achieved by the use of diodes which limit the direction of current flow. Thus the circuits employ half-wave or full-wave rectifier arrangements. Conventional cascade doubler may be combined, and in particular further voltage multiplication may be achieved by employing many cascade doublers in series.

In general, by "liquid crystal display" or "LCD" we mean any structure comprising a liquid crystal composition and some means such as opposed planar electrodes for subjecting it to an electric field. Where two or more LCDs are provided it is not necessary that an optical change of every LCD be visible, although in general an optical change of at least one will be visible. For example, one or more of the LCDs may have opaque electrodes, and function simply as a capacitor. It may be found convenient to prepare a simple array of LCDs, which provide the desired visual change and also provide mere capacitance for the voltage multiplier.

At least one, and preferably substantially all, of the LCDs will have at least one transparent electrode. Indium tin oxide is a preferred material, which may be deposited onto a transparent plastics substrate. A liquid crystal composition may then be sandwiched between two such coated substrates. Some form of bussing will be provided by means of which a voltage can be applied to electrodes of selected LCDs. Two or more LCD, may share an electrode if desired. (Both electrodes may be shared, but such LCDs may be regarded as parts of a single larger LCD.)

It is desirable that the LCDs have a high volume resistivity to prevent leakage currents dissipating a voltage across the liquid crystal compositions. This may be particularly important where LCDs act as capacitors of the voltage multiplier. The volume resistivity of each LCD is preferably at least $10^9$, more preferably at least $10^{10}$, especially at least $10^{11}$ ohm cm. A typical maximum is $10^{15}$ ohm cm. The capacitance of the LCDs will depend on their function, if any, in the voltage multiplier, but values 10–10,000, especially 100–1,000 farads per square cm may be regarded as typical.

It is also preferred that the liquid crystal composition be encapsulated. A liquid crystal composition is said to be encapsulated when a quantity thereof is combined in a containment or encapsulation medium or material. Encapsulated liquid crystal compositions can be made by mixing together a liquid crystal composition and an encapsulation medium and permitting or causing the formation of discrete capsules containing the liquid crystal composition. Preferably the encapsulating medium has a volume resistivity greater than $10^{11}$, more preferably at least $5 \times 10^{11}$, especially at least $10^{12}$ ohm cm. A preferred encapsulating medium is poly(vinyl alcohol).

The encapsulating liquid crystal composition may be for example nematic (including twisted nematic) or smectic. The encapsulation of liquid crystals, in particular nematic liquid crystals, is described in U.S. Pat. No. 4,435,047 (Fergason) and U.S Pat. No. 4,591,233 (Fergason), the disclosures of which are incorporated herein by reference.

Encapsulated smectic liquid crystal compositions offer an advantage for certain applications, in that they can have memory, that is, after undergoing a transition from one typical state to another, the composition remains in that other state even after the applied voltage is removed. The composition can be returned to its original state by heating. Thus, where it is necessary or desirable to have a semi-permanent indication of voltage, encapsulated smectic liquid crystal compositions may be preferred. The encapsulation of smectic liquid crystal compositions is described in U.S. application Ser. No. 740,218 (Fergason), filed June 3, 1985, the disclosure of which is incorporated herein by reference.

As used in this specification, the term "liquid crystal composition" includes discrete liquid crystal compounds, blends of liquid crystals, and encapsulated liquid crystals.

The liquid crystal composition may have a positive dielectric anisotropy. An example of such a composition is that known as E7 supplied by British Drug House. Positive dielectric anisotropic liquid crystal compositions are characterized by an increase in their capacitance as the applied voltage is increased from the threshold voltage to the saturation voltage, i.e. as the molecular rearrangement progresses. As capacitance increases, the voltage drop across the LCD becomes smaller than it otherwise would. When the LCD is used in combination with another capacitor, this has the effect of relatively increasing the fraction of initial voltage across the LCD (making the optical change occur earlier) and decreasing the final voltage across it (making breakdown of the LCD less of a risk).

The LCDs and basic voltage multiplier may be used together with other electrical components. For example, where the device of the invention is intended to operate by capacitive connection to the electrical component under test, and where capacitive path to ground is completed by the human body, a large resistor can be placed in series with the contact that the operator is to touch. The device should be safe in the absence of such a resistor, but a resistor of at least 1 megohm, preferably at least 10 megohms for each 100 V to be tested will provide further protection. Zener diodes etc. may be employed to limit the maximum voltage that can be developed across selected parts of the device.

The invention is further illustrated with reference to the accompanying drawings, in which FIG. 1 illustrates a single pole voltage probe 1. The probe has a contact 2 which can be used to make electrical connection to an electrical component whose voltage is to be tested. That electrical connection may be capacitive. A contact 3 is provide by means of which a second electrical connection, again preferably capacitive may be made. The probe may be hand-held, the second electrical connection being made via the holder's body. FIG. 1 schematically shows an array of LCDs powered by a voltage multiplier 5.

A voltage multiplier employing LCDs as its capacitors is illustrated in FIGS. 2A, 2B or 4.

FIGS. 2A and 2B show cascade type voltage multipliers, comprising LCDs 4, having a liquid crystal composition 6 sandwiched between electrodes 7, and diodes 8a, 8b, and being powered by an A.C. voltage source 9 of peak value V. In a half cycle when the upper contact of supply 9 is positive, diode 8a will be conducting and the LCD 4a, which acts as a capacitor, will become charged as shown. If the threshold voltage of the LCD 4a is no greater than V volts, an optical change will be noticeable. Thus, the LCD is responsive to the peak rather than the r.m.s. value of the applied voltage. On the next half cycle of supply 9, LCD 4a will discharge in series with the supply 9 creating a charge of 2V across LCD 4b. If the threshold voltage of LCD 4b is no greater than 2V, then a visible change may be noted there too. Thus, the device illustrated in FIG. 2A may employ one LCD (or array of LCDs) having a threshold value of, say, slightly below V and a second LCD (or array) having a threshold value slightly above V (but less than 2V, say). The device will then be able to indicate whether supply 9 was functioning properly (both LCDs switch), power is low (one LCD only switches) or substantially no power is delivered (neither LCD switches).

In FIG. 3 a simple capacitor 10 (i.e. not an LCD) is used in the first stage of the voltage multiplier circuit, and two LCDs, each having a threshold voltage of V, are applied to the output of the multiplier. This shows how the invention can allow a greater number of LCDs to be powered by a given source, and hence how visibility can be increased.

The idea of FIGS. 2A and 2B may be combined in a single device, and a device may incorporate additional voltage multiplying stages.

A conventional voltage multiplier is shown in FIG. 3. In a first half cycle from power supply 9, diode 8a is conductive and capacitor 10a becomes charged to the peak voltage V of the supply. In an opposite half-cycle, diode 8b is conducting and capacitor 10b becomes charged, again to peak V. Since capacitors 10a and 10b are in series, they can discharge in series into the load, in this case two LCDs, each of threshold voltage V. This circuit may be incorporated into a device of the invention.

FIG. 4 shows a device of the invention 1 having contacts 2 and 3, and four LCDs (or arrays thereof) so located as part of a voltage multiplier that a source of peak voltage V volts produces V, 2V, 3V and 4V across respective LCDs. If the LCDs had the same threshold value, for example V volts, then the device would be able to distinguish between applied voltages of 0, V/4, V/3, V/2 and V volts. Alternatively, LCDs of other threshold values may be used; in any case, the device is able to distinguish between 5 different applied voltages. In the illustrated embodiment alternate LCDs share an electrode, although this need not be so.

I claim:

1. A voltage testing device for testing the voltage of an A.C. electrical component, which comprises:
   (a) a LCD;
   (b) a voltage multiplier; the LCD being connected to an output of the voltage multiplier; the voltage multiplier comprising a first capacitor across which is developed a voltage during one half cycle of the voltage being tested and which voltage multiplier, during a subsequent, opposite half cycle of the voltage being tested, adds the voltage so developed in the first capacitor to the voltage being tested and applies the added voltages across the LCD, thereby multiplying the voltage across the LCD; and
   (c) electrical contacts connected to an input of the voltage multiplier by means of which electrical connection can be made between the voltage multiplier and the electrical component.

2. A voltage testing device according to claim 1, wherein the first capacitor is a LCD.

3. A voltage measuring device for measuring an A.C. voltage, which comprises a voltage multiplier comprising first and second capacitors which are LCDs, a voltage being developed across the first capacitor during one half cycle of the voltage being tested and which voltage multiplier, during a subsequent, opposite half cycle of the voltage being tested, adds the voltage so developed in the first capacitor to the voltage being tested and applied the added voltages across the second capacitor, thereby multiplying the voltage across the second capacitor; the threshold voltage of the LCDs and the stage in the voltage multiplier at which they are located, being such that respective LCDs show an optical change at different test voltages.

4. A method of testing for an A.C. voltage of rms value $V_{rms}$ of an electrical component, which comprises:
   (a) providing a voltage testing device comprising a voltage multiplier and an LCD whose threshold voltage is greater than $V_{rms}$, the LCD being connected to an output of said voltage multiplier such that the LCD undergoes an optical change on the application of a voltage of $V_{rms}$ to an input of the voltage multiplier; the voltage multiplier comprising a first capacitor across which is developed a voltage during one half cycle of $V_{rms}$ and which voltage multiplier, during a subsequent, opposite half cycle of $V_{rms}$, adds the voltage so developed in the first capacitor to $V_{rms}$ and applies the added voltages across the LCD, thereby multiplying the voltage across the LCD;

(b) electrically connecting said input to the electrical component; and (c) observing an optical state of the LCD.

* * * * *